US012677633B2

(12) United States Patent
Shin et al.

(10) Patent No.: US 12,677,633 B2
(45) Date of Patent: Jul. 7, 2026

(54) DEVICE FOR HOLDING A SUBSTRATE, METHOD OF HOLDING A SUBSTRATE, AND APPARATUS FOR PROCESSING A SUBSTRATE

(71) Applicant: SEMES CO., LTD., Cheonan-si (KR)

(72) Inventors: Kyungsik Shin, Asan-si (KR);
Seunghwan Lee, Cheonan-si (KR);
Kyoungdon Lee, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 184 days.

(21) Appl. No.: 18/507,439

(22) Filed: Nov. 13, 2023

(65) Prior Publication Data

US 2024/0186167 A1     Jun. 6, 2024

(30) Foreign Application Priority Data

Dec. 1, 2022     (KR) ........................ 10-2022-0165492

(51) Int. Cl.
*H10P 72/50*          (2026.01)
*H10P 72/00*          (2026.01)
*H10P 72/30*          (2026.01)

(52) U.S. Cl.
CPC .......... *H10P 72/50* (2026.01); *H10P 72/0431* (2026.01); *H10P 72/3411* (2026.01)

(58) Field of Classification Search
CPC ............... H01L 21/68; H01L 21/67098; H01L 21/67778; H01L 21/68728; H01L 21/68742; H01L 21/67109; H01L 21/6838; H01L 21/67742; H01L 21/68735; H01L 21/68785
See application file for complete search history.

(56) References Cited

U.S. PATENT DOCUMENTS 6,786,974 B2 *   9/2004   Komiya ................ H01L 21/312
                                                             414/172
8,444,126 B2 *   5/2013   Siebert .................... H01L 21/68
                                                             269/21
(Continued)

FOREIGN PATENT DOCUMENTS

JP          H5-326676 A      12/1993
JP          H5-343506 A      12/1993
(Continued)

OTHER PUBLICATIONS

Office Action for Korean Application No. 10-2022-0165492 dated Jul. 10, 2024.

*Primary Examiner* — Hung V Nguyen
(74) *Attorney, Agent, or Firm* — Harness, Dickey & Pierce P.L.C

(57)          ABSTRACT

An apparatus for processing a substrate may include a substrate holding part configured to maintain and support a substrate, a substrate transfer part configured to load the substrate onto the substrate holding part and to unload the substrate from the substrate holding part, and a substrate processing part configured to heat the substrate or to cool the substrate. The substrate holding part may include a plate configured to maintain and support the substrate, guide parts configured to move the substrate into a central region of the plate, and an alignment part configured to move the guide parts toward the central region of the plate utilizing a vacuum suction mechanism.

18 Claims, 5 Drawing Sheets

(56) References Cited

U.S. PATENT DOCUMENTS

| 9,360,773 | B2 * | 6/2016 | Fukushi | ............. | G03F 7/70775 |
| 12,025,921 | B2 * | 7/2024 | Kim | ................. | H01L 21/67748 |
| 2011/0076117 | A1 * | 3/2011 | Iizuka | .............. | H01L 21/67748 |
| | | | | | 414/217 |
| 2013/0025114 | A1 * | 1/2013 | Mizubata | ........... | H01L 21/6838 |
| | | | | | 269/21 |

FOREIGN PATENT DOCUMENTS

| KR | 20-2001-0001893 | U | 1/2001 |
| KR | 2009-0036916 | A | 4/2009 |
| KR | 101231855 | B1 | 2/2013 |
| KR | 101909183 | B1 | 10/2018 |

* cited by examiner

<u>100</u>

25(27,29)

25(27,29,35)

DEVICE FOR HOLDING A SUBSTRATE, METHOD OF HOLDING A SUBSTRATE, AND APPARATUS FOR PROCESSING A SUBSTRATE

CROSS-REFERENCE TO RELATED APPLICATION

This application claims priority to Korean Patent Application No. 10-2022-0165492 filed on Dec. 1, 2022 in the Korean Intellectual Property Office (KIPO), the contents of which are herein incorporated by reference in its entirety.

BACKGROUND

1. Field

Example embodiments of the invention relate to a device for holding a substrate, a method of holding a substrate and an apparatus for processing a substrate. More particularly, example embodiments of the invention relate to a device for holding a substrate capable of maintaining a substrate such that the substrate can locate in a central region of a plate, a method of holding a substrate using such a device for holding a substrate, and an apparatus for processing a substrate including the device for holding a substrate.

2. Related Technology

To manufacture an integrated circuit device such as a semiconductor device, unit processes including a heating process or a cooling process may be performed on a substrate while maintaining the substrate on a plate. When the unit processes are performed on the substrate, the failures of the unit processes may be generated if the substrate is not sufficiently supported by the plate or the substrate is not maintained at a desired position on the plate.

To overcome such a problem, a guide part may be disposed adjacent to a peripheral region of the plate such that the substrate may be exactly placed in a central region of the plate. However, such a guide part may not exactly place the substrate in the central region of the plate. Further, when the substrate is not exactly disposed in the desired position on the plate, another failure may be caused while the substrate is transferred using a transfer member.

SUMMARY

It is one object of the invention to provide a substrate holding device capable of exactly maintaining a substrate in a desired position of a plate.

It is another object of the invention to provide a method of holding a substrate holding device capable of exactly maintaining the substrate in a desired position of a plate.

It is still another object of the invention to provide an apparatus for processing a substrate including a substrate holding device capable of exactly maintaining a substrate in a desired position of a plate.

According to an aspect of the invention, there is provided a substrate holding device. The substrate holding device may include a plate configured to maintain and support a substrate, a guide part configured to move the substrate into a central region of the plate, and an alignment part configured to move the at least one guide part toward the central region of the plate utilizing a vacuum suction mechanism.

In example embodiments, the at least one guide part may include an inclined portion being inclined toward the central region of the plate in a downward direction and a sidewall portion vertically extending from the inclined portion. The substrate may slidably move on the inclined portion toward the central region of the plate and the substrate may contact the sidewall portion.

In example embodiments, the substrate holding device may additionally include 2N (wherein N is a positive integer) guide parts disposed adjacent to a peripheral region of the plate centering the central region of the plate.

In example embodiments, the 2N guide parts may be disposed by substantially the same distance along a circumference of the plate.

In example embodiments, the alignment part may include a passage configured to extend from a peripheral region of the plate to the central region of the plate, a vacuum providing part configured to apply a suction force to the at least one guide part through the passage, and a path providing part configured to provide a path along which the at least one guide moves from the peripheral region of the plate to the central region of the plate.

In example embodiments, the path providing part may be connected to the passage.

In example embodiments, the substrate holding device may additionally include at least one return part configured to return the at least one guide part from the central region of the plate to an initial position adjacent to a peripheral region of the plate.

In some example embodiments, the least one return part may be configured to apply an elastic force to the at least one guide part.

In other example embodiments, the least one return part may be configured to spray an air to the at least one guide part.

According to another aspect of the invention, there is provided a method of holding a substrate. The method of holding a substrate may include placing a substrate on a plate, slidably moving the substrate into a central region of the plate, and aligning the substrate to a desired position in the central region of the plate.

In example embodiments, the slidably moving of the substrate may be performed using guide parts for moving the substrate into the central region of the plate.

In example embodiments, the method of holding a substrate may additionally include returning the guide parts from the central region of the plate to initial positions adjacent to a peripheral region of the plate.

According to still another aspect of the invention, there is provided an apparatus for processing a substrate. The apparatus for processing a substrate may include a substrate holding part configured to maintain and support a substrate, a substrate transfer part configured to load the substrate onto the substrate holding part and to unload the substrate from the substrate holding part, and a substrate processing part configured to heat the substrate or to cool the substrate. In this case, the substrate holding part may include a plate configured to maintain and support the substrate, guide parts configured to move the substrate into a central region of the plate, and an alignment part configured to move the guide parts toward the central region of the plate utilizing a vacuum suction mechanism.

In example embodiments, the apparatus for processing a substrate may additionally include a lift pin configured to move through the substrate holding part in an upward direction and in a downward direction.

In example embodiments, each of the guide parts may include an inclined portion being inclined toward the central region of the plate in a downward direction and a sidewall portion vertically extending from the inclined portion. The substrate may slidably move on the inclined portion toward the central region of the plate and the substrate may contact the sidewall portion.

In example embodiments, the substrate holding part may include 2N (wherein N is a positive integer) guide parts disposed adjacent to a peripheral region of the plate centering the central region of the plate.

In example embodiments, the alignment part may include a passage configured to extend from a peripheral region of the plate to the central region of the plate, a vacuum providing part configured to apply a suction force to the at least one guide part through the passage, and a path providing part configured to provide a path along which the at least one guide moves from the peripheral region of the plate to the central region of the plate.

In example embodiments, the substrate holding part may additionally include return parts configured to respectively return the guide parts from the central region of the plate to initial positions adjacent to a peripheral region of the plate.

In some example embodiments, each of the return parts may be configured to apply an elastic force to each of the guide parts.

In other example embodiments, each of the return parts may be configured to spray an air to each of the guide part.

According to example embodiments, the substrate may be loaded on the plate of the apparatus for processing a substrate before a predetermined unit process is performed on the substrate, and then the substrate may be moved into the central region of the plate by using the guide parts and the alignment part. In this case, the substrate may be exactly disposed in a desired position of the central region of the plate by the alignment part utilizing the vacuum suction mechanism. Further, as the lift pin supporting the substrate moves through the substrate holding part in the downward direction, the substrate may slidably move toward the central region of the plate along the inclined portions 31 of the guide parts. After the unit process is completed, the substrate may be unloaded from the plate, and then the guide parts may return to the initial positions, respectively, by the return parts. The substrate may be exactly maintained in the desired portion on the plate while the plate sufficiently supports the substrate so that the failure of the unit process may be prevented and the reliability of the integrated circuit device manufactured by the apparatus for processing a substrate 100 may be improved.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
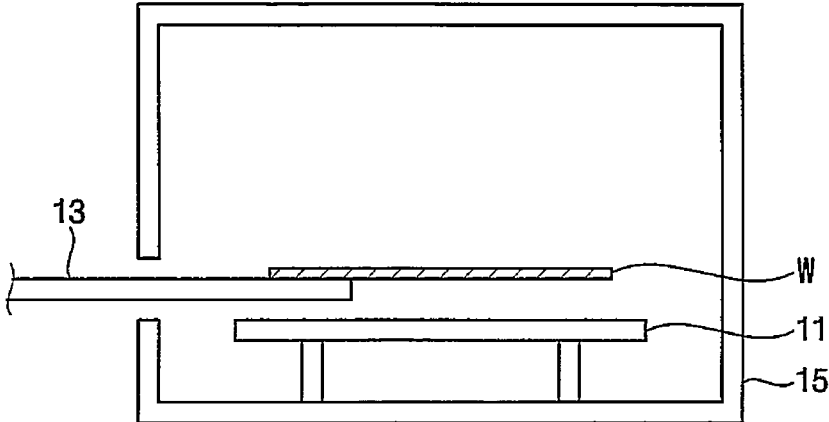
FIG. 1 is a schematic cross-sectional view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view illustrating an apparatus for processing a substrate in accordance with example embodiments of the invention.

Referring to FIG. 1, an apparatus for processing a substrate 100 in accordance with example embodiments may be employed in processes for manufacturing an integrated circuit device such as a semiconductor device. For example, the apparatus for processing a substrate 100 may be used in a process of heating a substrate W to a predetermined temperature and/or in a process of cooling the substrate W to a predetermined temperature.

In example embodiments, the apparatus for processing a substrate 100 may include a substrate holding device 11, a substrate transfer part 13, a substrate processing part 15, etc. Hereinafter, the substrate holding device 11 may be referred to as the substrate holding part 11.

The substrate holding part 11 may maintain the substrate W in a desired position while a unit process such as the process of heating the substrate W or the process of cooling the substrate W is performed on the substrate W.

The substrate transfer part 13 of the apparatus for processing a substrate 100 may load the substrate W onto the substrate holding part 11 and also may unload the substrate W from the substrate holding part 11. The substrate transfer part 13 may include a grasping part for holding a peripheral region of a rear face of the substrate W and a robot art which may have a multi-joint structure connected to the grasping part.

The substrate processing part 15 may perform the unit process on the substrate W disposed on the substrate holding part 11. For example, the substrate processing part 15 may perform the process of heating the substrate W positioned on the substrate holding part 11, or the process of cooling the substrate W placed on the substrate holding part 11. In example embodiments, the substrate processing part 15 may include a heating chamber for heating the substrate W therein or a cooling chamber for cooling the substrate W therein.

While performing the unit process on the substrate W using the apparatus for processing a substrate 100 including the substrate holding part 11, the substrate transfer part 13 and the substrate processing part 15, the failure of the unit process may occur if the substrate W is not sufficiently supported by the substrate holding part 11 or the substrate W is not placed in the desired position on the substrate holding part 11. Considering such a problem, the substrate holding part 11 according to example embodiments may have a configuration for effectively supporting and exactly placing the substrate W in the desired position.

Hereinafter, it will be described in detail the configuration of the substrate holding part 11 of the apparatus for processing a substrate 100 according to example embodiments with reference to the accompanying drawings.

Figure 2:
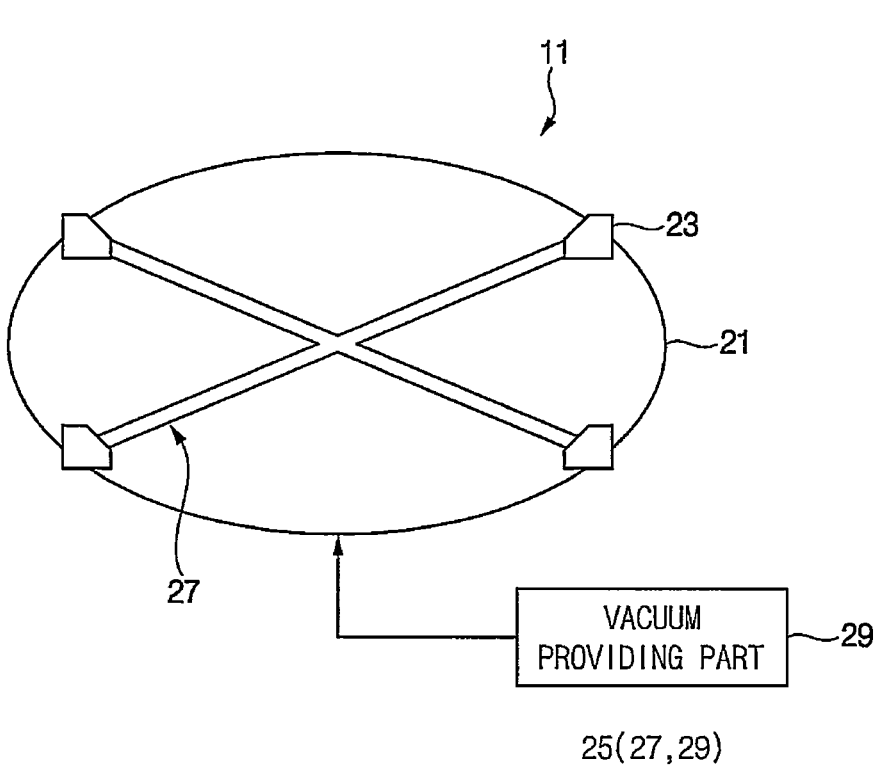
FIG. 2 is a schematic plan view illustrating a substrate holding part of an apparatus for processing a substrate in accordance with example embodiments of the invention.
Figure 3:
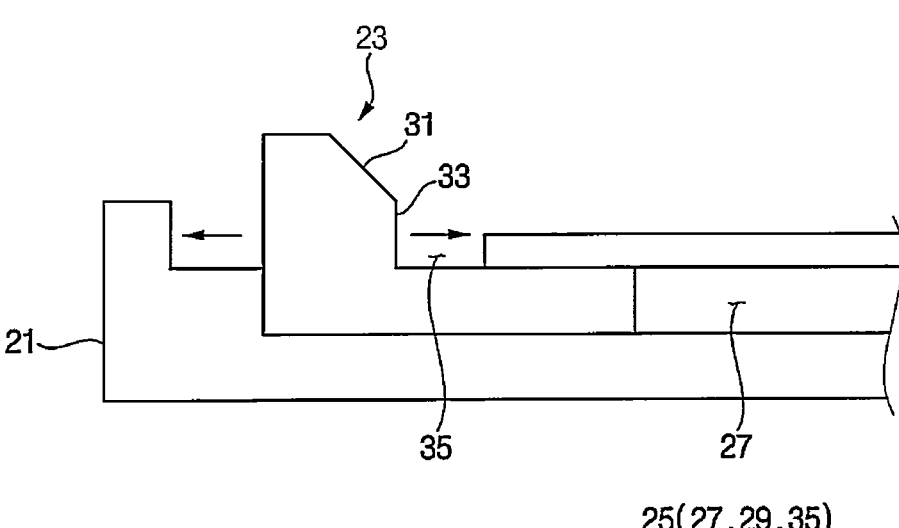
FIG. 3 is a schematic cross-sectional illustrating a substrate holding part of an apparatus for processing a substrate in accordance with example embodiments of the invention.

FIG. 2 is a schematic plan view illustrating the substrate holding part 11 of the apparatus for processing a substrate 100 in accordance with example embodiments of the invention. FIG. 3 is a schematic cross-sectional illustrating the substrate holding part 11 of the apparatus for processing a substrate 100 in accordance with example embodiments of the invention.

Referring to FIGS. 2 and 3, the substrate holding part 11 of the apparatus for processing a substrate 100 according to example embodiments may include a plate 21, at least one guide part 23, an alignment part 25, at least one return part, etc.

The plate 21 of the substrate holding part 11 may support and maintain the substrate W when the unit process such as the process of heating the substrate W or the process of cooling the substrate W is performed on the substrate W. In this case, the plate 21 may have dimensions substantially larger than those of the substrate W.

The at least one guide part 23 of the substrate holding part 11 may move the substrate W placed on the plate 21 into the central region of the plate 21. For example, the guide part 23 may enable the substrate W to slidably move into the central region of the plate 21. Using the guide part 23, the substrate W may be exactly disposed in the central region of the plate 21.

The guide part 23 may be disposed adjacent to the peripheral region of the plate 21. In example embodiments, the guide part 23 may include an inclined portion 31 and a sidewall portion 33. The inclined portion 31 may be downwardly inclined toward the central region of the plate 21 such that the substrate W may slidably move to the central region of the plate 21. The sidewall portion 33 may substantially downwardly extend from the inclined portion 31.

The alignment part 25 of the substrate holding part 11 may be configured to align the substrate W with respect to the central region of the plate 21. The alignment part 25 may move the guide part 23 from the peripheral region of the plate 21 toward the central region of the plate 21. In example embodiments, the alignment part 25 may move the guide part 23 by utilizing a vacuum suction mechanism. For example, the alignment part 25 may provide a vacuum suction from the peripheral region of the plate 21 toward the central region of the plate 21. Using the vacuum suction provided by the alignment part 25, the guide part 23 may move toward the central region of the plate 21.

In the apparatus for processing a substrate 100 according to example embodiments, the substrate W may be slidably move into the central region of the plate 21 by the inclined portion 31 of the guide part 23, and then the substrate W contacting the sidewall portion 33 of the guide part 23 may be aligned relative to the central region of the plate 21. In other words, the apparatus for processing a substrate 100 may include the guide part 23 and the alignment part 25 so that the substrate W may move into the central region of the plate 21 and may be aligned in the central region of the plate 21. Accordingly, the substrate W may be exactly disposed in the desired portion on the plate 21.

If the guide part 23 is disposed adjacent to one end of the plate 21, the guide part 23 may not properly move the substrate W into the central region of the plate 21. Considering this problem, the apparatus for processing a substrate 100 may include a plurality of guide parts 23 each of which may be adjacent to the peripheral region of the plate 21.

In example embodiments, the apparatus for processing a substrate 100 may include 2N (N is a positive integer) guide parts 23. That is, the apparatus for processing a substrate 100 may include an even number guide parts 23. In this case, the 2N guide parts 23 may be faced with each other centering the central region of the plate 21. Further, the 2N guide parts 23 may be separated by a substantially identical distance along the peripheral region of the plate 21.

In one example, the apparatus for processing a substrate 100 may include four guide parts 23 disposed by an interval of about 90° along the circumference of the plate 21 when the plate 21 has a substantially circular shape. In another example, the apparatus for processing a substrate 100 may include six guide parts 23 disposed by an interval of about 60°. In still another example, the apparatus for processing a substrate 100 may include eight guide parts 23 disposed by an interval of about 45°. Therefore, the substrate W may be exactly moved into the central region of the plate 21 by the plurality of guide parts 23.

As described above, the alignment part 25 of the substrate holding part 11 may move the guide parts 23 adjacent to the peripheral region of the plate 21 toward the central region of the plate 21. In example embodiments, the alignment part 25 may include a passage 27, a vacuum providing part 29 and a path providing part 35.

The passage 27 of the alignment part 25 may extend from the central region of the plate 21 to the peripheral region of the plate 21. The alignment part 25 may include a plurality of passages 27 corresponding to the plurality of guide parts 23, respectively. For example, the alignment part 25 may include 2N passages 27 corresponding to the 2N guide parts 23, respectively.

The vacuum providing part 29 of the alignment part 25 may provide suction forces to the guide parts 23 through the passages 27. For example, the vacuum providing part 29 may include a vacuum pump connected to the passages 27. The vacuum providing part 29 may apply the suction forces to the guide parts 23 through the passages 27 such that the guide parts 23 may move from the peripheral region of the plate 21 to the central region of the plate 21.

The path providing part 35 of the alignment part 25 may provide a path through which the guide part 23 may move. The path providing part 35 may provide a plurality of paths corresponding to the plurality of guide parts 23, respectively. For example, the path providing part 35 may provide 2N paths corresponding to the 2N guide parts 23, respectively. In this case, the paths of the path providing part 35 may be respectively connected to the passages 27.

As illustrated in FIGS. 2 and 3, the substrate W may slidably move toward the central region of the plate 21 along the inclined portions 31 of the guide parts 23 when the substrate W is placed on the plate 21. In addition, using the alignment part 25 having the above-described configuration, the guide parts 23 may move the substrate W contacting the sidewall portions 33 into the central region of the plate 21. Therefore, the substrate W may be exactly located in the desired position in the central region of the plate 21.

The at least one return part of the apparatus for processing a substrate 100 may return the guide parts 23 to initial positions adjacent to the peripheral region of the plate 21 after the substrate W is disposed in the central region of the plate 21. For example, the at least one return part may release the suction forces applied to the guide parts 23 by the alignment part 25.

Figure 4:
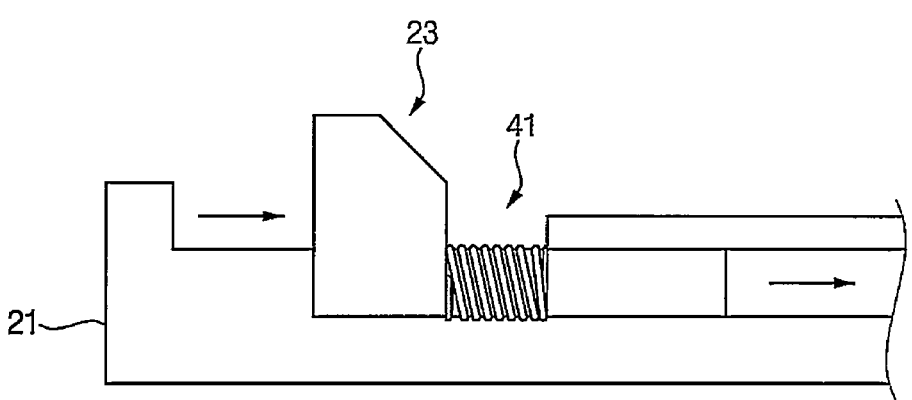
FIGS. 4 and 5 are schematic cross-sectional views illustrating an operation of a return part of an apparatus for processing a substrate in accordance with example embodiments of the invention.
Figure 5:
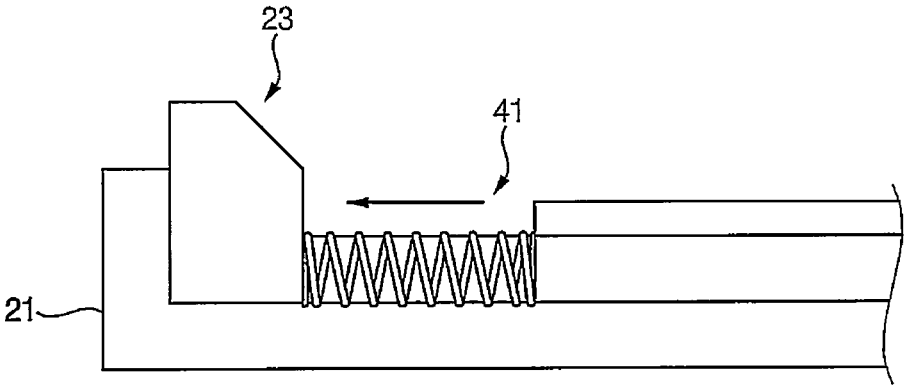

FIG. 4 and FIG. 5 are schematic cross-sectional views illustrating the operation of the return part of the apparatus for processing a substrate 100 in accordance with example embodiments of the invention.

Referring to FIGS. 4 and 5, the apparatus for processing a substrate 100 may include a return part 41 which may return the guide part 23 to the initial position by utilizing an elastic mechanism. In this case, the apparatus for processing a substrate 100 may include a plurality of return parts 41 corresponding to the plurality of guide parts 23, respectively. For example, the apparatus for processing a substrate 100 may include 2N return parts 41. Each of the return parts 41 may return each of the guide parts 23 to each of the initial positions using an elastic force. For example, each of the return parts 41 may include a spring member.

As illustrated in FIG. 4, the alignment part 25 may apply the suction forces to the guide parts 23 so as to move the substrate W into the central region of the plate 21. After the substrate W is disposed in the desired position of the central region of the plate 21, the return parts 41 may provide the elastic forces to the guide parts 23 in order to return the guide parts 23 to the initial positions as illustrated in FIG. 5. At this time, the suction forces applied to the guide parts 23 may be released by the elastic forces provided from the return parts 41.

Figure 6:
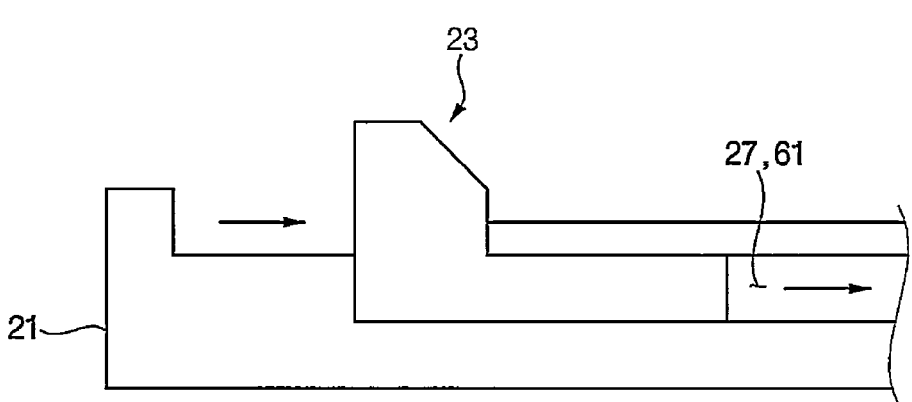
FIGS. 6 and 7 are schematic cross-sectional views illustrating operation of a return part of an apparatus for processing a substrate 100 in accordance with some example embodiments of the invention.
Figure 7:
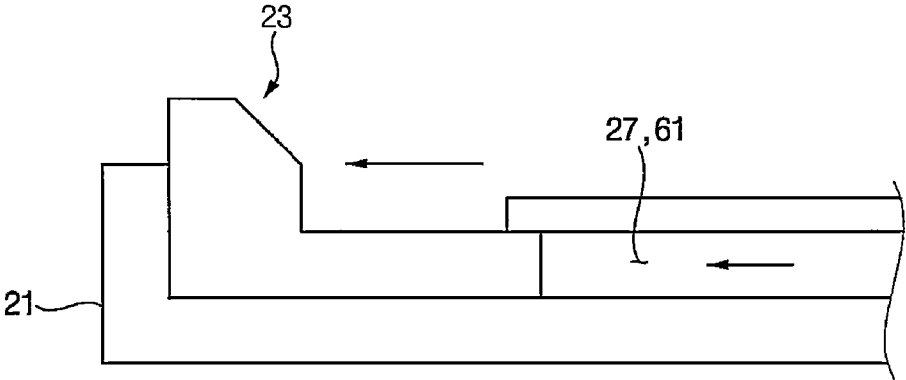

FIGS. 6 and 7 are schematic cross-sectional views illustrating the operation of the return part of the apparatus for processing a substrate 100 in accordance with some example embodiments of the invention.

Referring to FIGS. 6 and 7, the apparatus for processing a substrate 100 may include a return part 61 which may return the guide part 23 to the initial position by utilizing a positive pressure. Here, the apparatus for processing a substrate 100 may include a plurality of return parts 61 corresponding to the plurality of guide parts 23, respectively. For example, the apparatus for processing a substrate 100 may include 2N return parts 61. Each of the return parts 61 may spray an air to each of the guide parts 23, and thus each of the guide parts 23 may return to each of the initial positions. For example, each of the return parts 61 may include an air spray member.

As illustrated in FIG. 6, the alignment part 25 may apply the suction forces to the guide parts 23 for moving the substrate W into the central region of the plate 21. After the substrate W is located in the desired position of the central region of the plate 21, the return parts 61 may provide the airs to the guide parts 23 so as to return the guide parts 23 to the initial positions as illustrated in FIG. 7. At this time, the suction forces applied to the guide parts 23 may be released by the pressures of the airs provided from the return parts 61.

Figure 8:
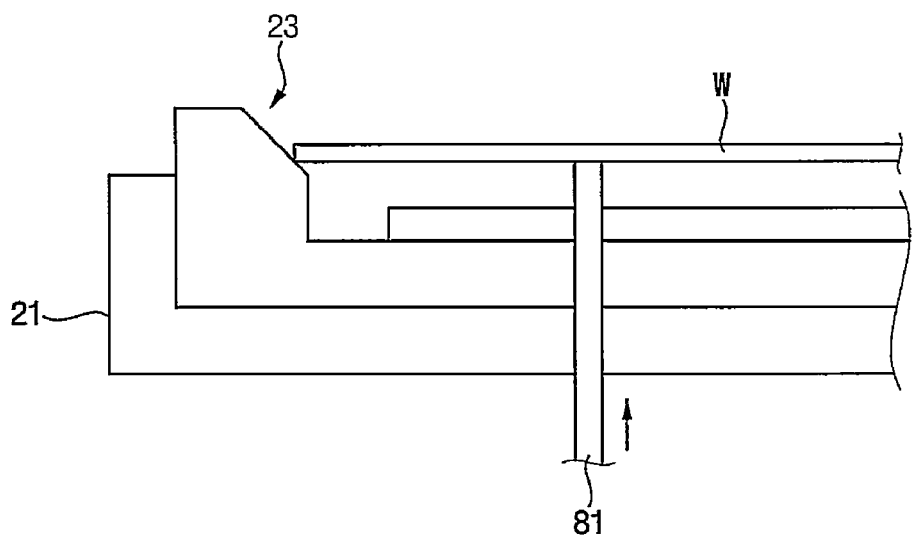
FIGS. 8 and 9 are schematic cross-sectional views illustrating a lift pin of an apparatus for processing a substrate in accordance with some example embodiments of the invention.
Figure 9:
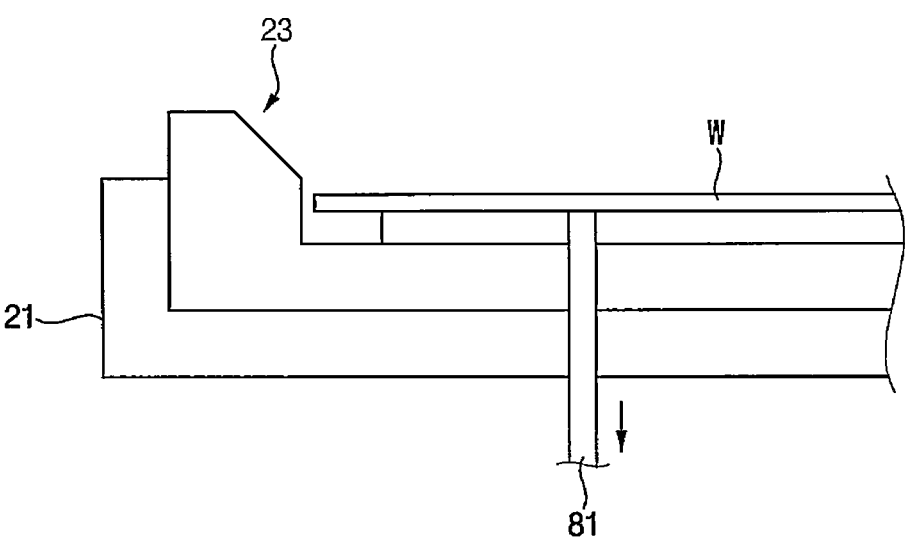

FIGS. 8 and 9 are schematic cross-sectional views illustrating a lift pin of the apparatus for processing a substrate 100 in accordance with some example embodiments of the invention.

Referring to FIGS. 8 and 9, the apparatus for processing a substrate 100 may include at least one lift pin 81. The lift pin 81 may move through the substrate holding part 11 in an upward direction and in a downward direction.

In some example embodiments, the lift pin 81 of the apparatus for processing a substrate 100 may move through the substrate holding part 11 in the upward direction and may contact a bottom face of the substrate W when the substrate W is loaded on the plate 21. The lift pin 81 supporting the substrate W may move through the substrate holding part 11 in the downward direction, and then the substrate W may be placed on the plate 21. In case that the lift pin 81 supporting the substrate W moves in the downward direction, the substrate W may slidably move along the inclined portions 31 of the guide parts 23 such that the substrate W may locate in the desired position in the central region of the plate 21.

Hereinafter, a method of holding a substrate using the apparatus for processing a substrate according to example embodiments will be described in detail.

In the method of holding a substrate according to example embodiments, the substrate W may be loaded on the plate 21 of the apparatus for processing a substrate 100 before the unit process is performed on the substrate W, and then the substrate W may be moved into the central region of the plate 21 by using the guide parts 23 and the alignment part 25. In this case, the substrate W may be exactly disposed in the desired position of the central region of the plate 21 by the alignment part 25 utilizing the vacuum suction mechanism. Further, as the lift pin 81 supporting the substrate W moves through the substrate holding part 11 in the downward direction, the substrate W may slidably move toward the central region of the plate 21 along the inclined portions 31 of the guide parts 23.

After the unit process is completed, the substrate W may be unloaded from the plate 21, and then the guide parts 23 may return to the initial positions, respectively, by the return parts 41 and 61.

According to example embodiments of the invention, the substrate W may be exactly maintained in the desired portion on the plate 21 while the plate 21 sufficiently supports the substrate so that the failure of the unit process may be prevented and the reliability of the integrated circuit device manufactured by the apparatus for processing a substrate 100 may be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A substrate holding device, comprising:
a plate configured to maintain and support a substrate;
at least one guide part extending from an upper portion of the plate near a periphery of the plate; and an alignment part configured to align a movement of the at least one guide part from the periphery of the plate toward a central region of the plate via a vacuum force from a vacuum suction mechanism
the alignment part includes
a passage configured to extend from the periphery of the plate to the central region of the plate;
a vacuum providing part configured to apply a suction force to the at least one guide part through the passage; and
a path providing part configured to provide a path along which the at least one guide part moves from the periphery of the plate to the central region of the plate.

2. The substrate holding device of claim 1, wherein the at least one guide part includes an inclined portion being inclined toward the central region of the plate in a downward direction and a sidewall portion vertically extending from the inclined portion, and
wherein the inclined portion is configured to slideably move the substrate toward the central region as the substrate contacts the sidewall portion.

3. The substrate holding device of claim 1, wherein the at least one guide part includes 2N guide parts disposed adjacent to the periphery of the plate centering the central region of the plate, wherein N is a positive integer.

4. The substrate holding device of claim 3, wherein the 2N guide parts are disposed by a same distance along a circumference of the plate.

5. The substrate holding device of claim 1, wherein the path providing part is connected to the passage.

6. The substrate holding device of claim 1, wherein the substrate holding device includes at least one return part configured to return the at least one guide part from the central region of the plate to an initial position adjacent to the periphery of the plate.

7. The substrate holding device of claim 6, wherein the least one return part is configured to apply an elastic force to the at least one guide part.

8. The substrate holding device of claim 6, wherein the least one return part is configured to spray an air to the at least one guide part.

9. A method of holding a substrate, comprising:
placing a substrate on a plate;
slidably moving guide parts toward a central region of the plate to guide the substrate to a desired position in the central region, the guide parts extending from an upper portion of the plate near a periphery of the plate prior to slidably moving toward the central region; and
aligning a movement of each one of the guide parts from the periphery of the plate toward a central region of the plate using an alignment part, of a plurality of alignment parts,
each one of the plurality of alignment parts including
a passage configured to extend from the periphery of the plate to the central region of the plate,
a vacuum providing part configured to apply a suction force to a respective one of the guide parts through the passage, and
a path providing part configured to provide a path along which a respective one of the guide parts moves from the periphery of the plate to the central region of the plate.

10. The method of claim 9, further comprising:
returning the guide parts from the central region of the plate to initial positions adjacent to the periphery of the plate.

11. An apparatus for processing a substrate, comprising:

a substrate holding part configured to maintain and support a substrate;

a substrate transfer part configured to load the substrate onto the substrate holding part and to unload the substrate from the substrate holding part; and a substrate processing part configured to heat the substrate or to cool the substrate, wherein the substrate holding part includes a plate configured to maintain and support the substrate;

guide parts extending from an upper portion of the plate near a periphery of the plate, the guide parts being configured to slideably move toward a central region of the plate to contact and move the substrate into the central region; and an alignment part configured to align a movement of the guide parts toward the central region of the plate utilizing a vacuum suction mechanism.

12. The apparatus for processing a substrate of claim 11, further comprising:

a lift pin configured to selectively move the substrate holding part in an upward direction or in a downward direction.

13. The apparatus for processing a substrate of claim 11, wherein each of the guide parts includes an inclined portion being inclined toward the central region of the plate in a downward direction and a sidewall portion vertically extending from the inclined portion, and wherein the substrate slidably moves on the inclined portion toward the central region of the plate as the substrate contacts the sidewall portion.

14. The apparatus for processing a substrate of claim 11, wherein the guide parts include 2N guide parts disposed adjacent to the periphery of the plate centering the central region of the plate, wherein N is a positive integer.

15. The apparatus for processing a substrate of claim 11, wherein the alignment part includes a passage configured to extend from the periphery of the plate to the central region of the plate;

a vacuum providing part configured to apply a suction force to the guide parts through the passage; and a path providing part configured to provide a path along which the guide parts move from the periphery of the plate to the central region of the plate.

16. The apparatus for processing a substrate of claim 11, wherein the substrate holding part further includes return parts configured to respectively return the guide parts from the central region of the plate to initial positions adjacent to the periphery.

17. The apparatus for processing a substrate of claim 16, wherein each of the return parts is configured to apply an elastic force to each of the guide parts.

18. The apparatus for processing a substrate of claim 17, wherein each of the return parts is configured to spray an air onto each one of the guide parts.

* * * * *